(12) United States Patent
Cai

(10) Patent No.: US 9,177,972 B1
(45) Date of Patent: Nov. 3, 2015

(54) ARRAY SUBSTRATE, FABRICATING METHOD THEREOF, AND DISPLAY DEVICE

(71) Applicants: Boe Technology Group Co., Ltd., Beijing (CN); Hefei Xinsheng Optoelectronics Technology Co., Ltd., Anhui (CN)

(72) Inventor: Zhenfei Cai, Beijing (CN)

(73) Assignees: Boe Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 14/495,917

(22) Filed: Sep. 25, 2014

(30) Foreign Application Priority Data

Jun. 25, 2014 (CN) .......................... 2014 1 0294603

(51) Int. Cl.
| | |
|---|---|
| *H01L 21/68* | (2006.01) |
| *H01L 27/12* | (2006.01) |
| *H01L 23/544* | (2006.01) |
| *H01L 29/423* | (2006.01) |
| *H01L 21/768* | (2006.01) |
| *H01L 21/3213* | (2006.01) |
| *H01L 21/311* | (2006.01) |
| *H01L 29/40* | (2006.01) |
| *H01L 51/00* | (2006.01) |
| *H01L 27/32* | (2006.01) |

(52) U.S. Cl.
CPC ........ *H01L 27/124* (2013.01); *H01L 21/31111* (2013.01); *H01L 21/32133* (2013.01); *H01L 21/76802* (2013.01); *H01L 23/544* (2013.01); *H01L 27/1259* (2013.01); *H01L 29/401* (2013.01); *H01L 29/42384* (2013.01); *H01L 21/68* (2013.01); *H01L 27/3248* (2013.01); *H01L 51/0012* (2013.01); *H01L 2223/54406* (2013.01); *H01L 2223/54426* (2013.01)

(58) Field of Classification Search
CPC .. H01L 21/68; H01L 51/0012; H01L 27/3248
See application file for complete search history.

(56) References Cited

U.S. PATENT DOCUMENTS

| | | | | |
|---|---|---|---|---|
| 6,455,347 | B1* | 9/2002 | Hiraishi et al. | 438/80 |
| 7,482,703 | B2* | 1/2009 | Hwang et al. | 257/797 |
| 2003/0146475 | A1* | 8/2003 | Lai | 257/359 |
| 2012/0178199 | A1* | 7/2012 | Savoy et al. | 438/49 |
| 2013/0153117 | A1* | 6/2013 | Kobayashi et al. | 156/67 |

\* cited by examiner

*Primary Examiner* — Allen Parker
(74) *Attorney, Agent, or Firm* — Calfee, Halter & Griswold LLP

(57) ABSTRACT

An array substrate and a display device incorporating the array substrate are disclosed. The array substrate includes an alignment mark formed in a source-drain electrode layer, and a detection hole formed in a region in a pixel electrode layer and a passivation layer that corresponds to the alignment mark, such that normal detection of the alignment mark can be carried out by irradiating an electronic beam into the detection hole. The structure of the array substrate reduces the likelihood of detection failures.

11 Claims, 3 Drawing Sheets

ARRAY SUBSTRATE, FABRICATING METHOD THEREOF, AND DISPLAY DEVICE

RELATED APPLICATIONS

The present application claims the benefit of Chinese Patent Application No. 201410294603.7, filed Jun. 25, 2014, the entire disclosure of which is incorporated herein by reference.

FIELD

This disclosure relates to display technology, particularly to an array substrate and a fabricating method thereof, as well as to a display device incorporating such an array substrate.

BACKGROUND

During a detection process of an array substrate, alignment settings are required, wherein the alignment process includes: applying a common voltage signal on a pad and using a detection device to emit electronic beams to an alignment mark region of the array substrate, such that a metal region in the alignment mark region will absorb electrons emitted by the detection device to form an electric current, whereas an etched region will not absorb electrons because there is no metal. The detection device determines whether the alignment is correct by sensing the electric current.

FIG. 1 shows a conventional array substrate including a region where an alignment mark structure is formed. The array substrate comprises a glass substrate 1, a common electrode 2, a gate insulation layer 3, an etch barrier layer 4, a passivation layer 5, and a pixel electrode layer 6. An alignment mark is fabricated on the pixel electrode layer 6, and the pixel electrode layer 6 is connected with the common electrode 2 via holes formed in the etch barrier layer 4, the gate insulation layer 3, and the passivation layer 5. In order to avoid a break in the pixel electrode layer 6 deposited in the aforementioned via hole region (as shown in the circled portion of FIG. 1), the gradients of the sidewalls of the via holes and the sizes of the via holes need to be strictly consistent. However, it is difficult to control the gradients of the sidewall of the via holes in the actual process of etching the via holes. Therefore, failure of the alignment mark often occurs.

SUMMARY

An array substrate is provided which can avoid, or at least mitigate, one or more of the above problems. For example, an array substrate is provided with an alignment mark less susceptible to failure.

According to an aspect of the present invention, an array substrate comprises a glass substrate, a gate and common electrode layer, a gate insulation layer, an etch barrier layer, a source-drain electrode layer, a passivation layer, and a pixel electrode layer formed sequentially on the glass substrate, wherein an alignment mark is formed in the source-drain electrode layer, wherein a first via hole is formed in the gate insulation layer and the etch barrier layer, wherein the alignment mark is connected with a common electrode in the gate and common electrode layer through the first via hole, and wherein a detection hole is formed in a region in the passivation layer and the pixel electrode layer that corresponds to the alignment mark.

Further, an "F"-shaped pattern may be formed in the alignment mark.

Further, the detection hole may be formed in a region to which the "F"-shaped pattern corresponds.

Further, the array substrate may be a fringe field switching substrate.

Such an array substrate can avoid or otherwise reduce the likelihood of failure of the alignment mark.

According to another aspect of the present invention, a method of fabricating an array substrate comprises: sequentially forming a gate and common electrode layer, a gate insulation layer, and an etch barrier layer on a glass substrate; etching the etch barrier layer and the gate insulation layer to form a first via hole; forming a source-drain electrode layer on the etch barrier layer and an inner wall of the first via hole; forming an alignment mark in the source-drain electrode layer, the alignment mark being connected with a common electrode in the gate and common electrode layer through the first via hole; forming a passivation layer and forming a pixel electrode layer on the passivation layer; and etching a region in the pixel electrode layer and the passivation layer that corresponds to the alignment mark to form a detection hole.

Further, the forming of an alignment mark in the source-drain electrode layer may comprise: forming an "F"-shaped pattern in the source-drain electrode layer by etching.

Further, the etching of a region in the pixel electrode layer and the passivation layer that corresponds to the alignment mark to form a detection hole may comprise: etching a region in the pixel electrode layer and the passivation layer that corresponds to the "F"-shaped pattern to form the detection hole.

According to a further aspect of the present invention, a display device comprising the array substrate described above is provided.

The array substrate may comprise an alignment mark formed in a source-drain electrode layer, and a detection hole formed in a region in a pixel electrode layer and a passivation layer that corresponds to the alignment mark, such that normal detection of the alignment mark can be carried out by irradiating an electronic beam into the detection hole. Moreover, because only a gate insulation layer and an etch barrier layer may be between the alignment mark and a common electrode line, only one dry-etching is required to realize the connection of the alignment mark and the common electrode, thereby solving or otherwise mitigating the problem of an inconsistent gradient of the sidewall of a via hole caused by fabricating the same via hole by several dry-etchings, and consequently reducing the possibility of a detection failure caused by a break in a pixel electrode at the sidewall of the via hole.

DETAILED DESCRIPTION

Various exemplary embodiments of the present invention will now be described in detail in conjunction with the drawings. These embodiments are being provided to assist in the explanation of the general inventive concepts and are not intended to otherwise limit the scope of the present invention.

It should be understood that when it is stated that an element or a layer is "on," "connected to," or "coupled to" another element or layer, it can be on, connected to, or coupled to another element or layer directly, or there may also be one or more intermediate elements or layers. Conversely, when it is stated that an element is "directly on," "directly connected to," or "directly coupled to" another element or layer, no intermediate element or layer exists.

Figure 1:
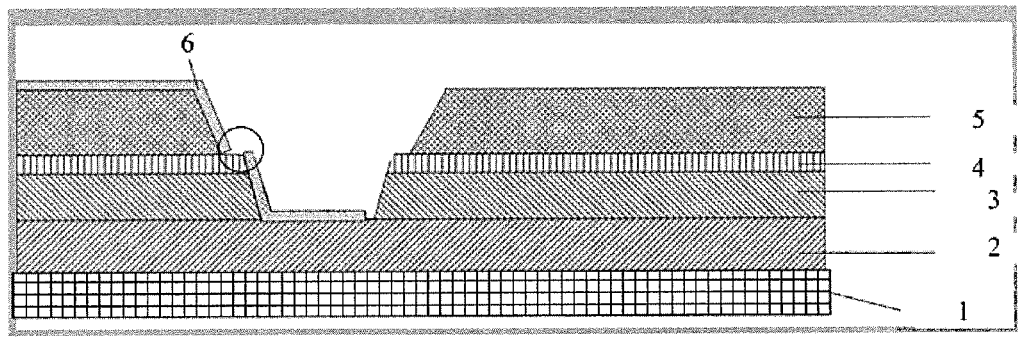
FIG. 1 is a schematic sectional view of a region of a conventional array substrate where an alignment mark structure is formed.
Figure 2:
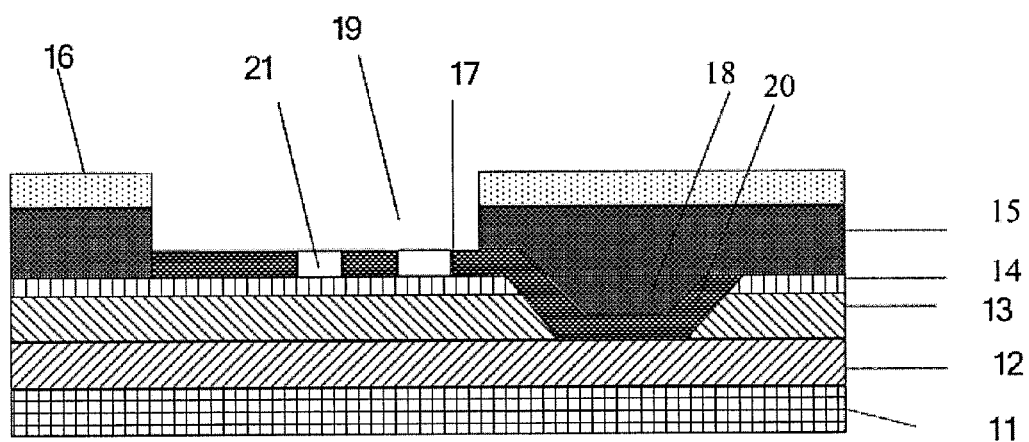
FIG. 2 is a schematic sectional view of a region of an array substrate where an alignment mark structure is formed according to an exemplary embodiment of the present invention.

According to an exemplary embodiment of the present invention, an array substrate, as shown in FIG. 2, comprises a glass substrate 11, a gate and common electrode layer 12, a gate insulation layer 13, an etch barrier layer 14, a source-drain electrode layer 20, a passivation layer 15, and a pixel electrode layer 16 formed on the glass substrate 11. For example, the array substrate may be a thin film transistor (TFT) array substrate. As for the TFT array substrate, an active layer (not shown in the figure) may be formed between the gate insulation 13 layer and the etch barrier layer 14 in a region where the TFT structure thereof is located. The active layer, for example, may be made of metal oxides.

In the exemplary embodiment shown in FIG. 2, an alignment mark 17 is formed in the source-drain electrode layer 20, and a first via hole 18 is formed in the gate insulation layer 13 and the etch barrier layer 14. The alignment mark 17 is connected with a common electrode in the gate and common electrode layer 12 through the first via hole 18. A detection hole 19 is further formed in a region in the passivation layer 15 and the pixel electrode layer 16 that corresponds to the alignment mark 17.

In an exemplary embodiment, the gate and common electrode layer 12 comprises an integrally formed gate pattern and common electrode pattern. The gate pattern comprises a gate and a gate line. The common electrode pattern comprises a common electrode and a common electrode line. In an exemplary embodiment, the source-drain electrode layer 20 comprises a source-drain electrode pattern and a data signal line pattern. A second via hole (not shown) may also be formed in the passivation layer 15, such that the source-drain electrode layer 20 may be connected with the pixel electrode layer 16 through the second via hole. As for the TFT array substrate, the gate, the active layer, and the source-drain electrode are generally formed in the region of the TFT structure. Since the TFT structure itself is well known in the art, further explanation thereof will not be provided.

In the case of a TFT array substrate, the alignment mark is generally formed in a non-TFT region. This non-TFT region typically does not include the gate, the active layer, or the source-drain electrode. The alignment mark may be located in any suitable region of the array substrate including those shown and described herein.

In an exemplary embodiment, the array substrate according to the embodiment of the present invention comprises an alignment mark formed in a source-drain electrode layer, and a detection hole formed in a region in a pixel electrode layer and a passivation layer that corresponds to the alignment mark, such that normal detection of the alignment mark can be carried out by irradiating an electronic beam into the detection hole. Moreover, because there may only be a gate insulation layer and an etch barrier layer between the alignment mark and a common electrode line, only one dry-etching is required to realize connection of the alignment mark and a common electrode, thereby solving or otherwise mitigating the problem of inconsistent gradient of the sidewall of a via hole caused by fabricating the same via hole by several dry-etchings, and also reducing the possibility of detection failures caused by a break of a pixel electrode at the sidewall of the via hole. Additionally, since the materials of the alignment mark and the source-drain electrode are the same, the efficiency of absorbing electrons can be improved relative to the conventional manner of using pixel electrode materials (generally ITO) as the alignment mark, thereby providing increased detection sensitivity.

Figure 3:
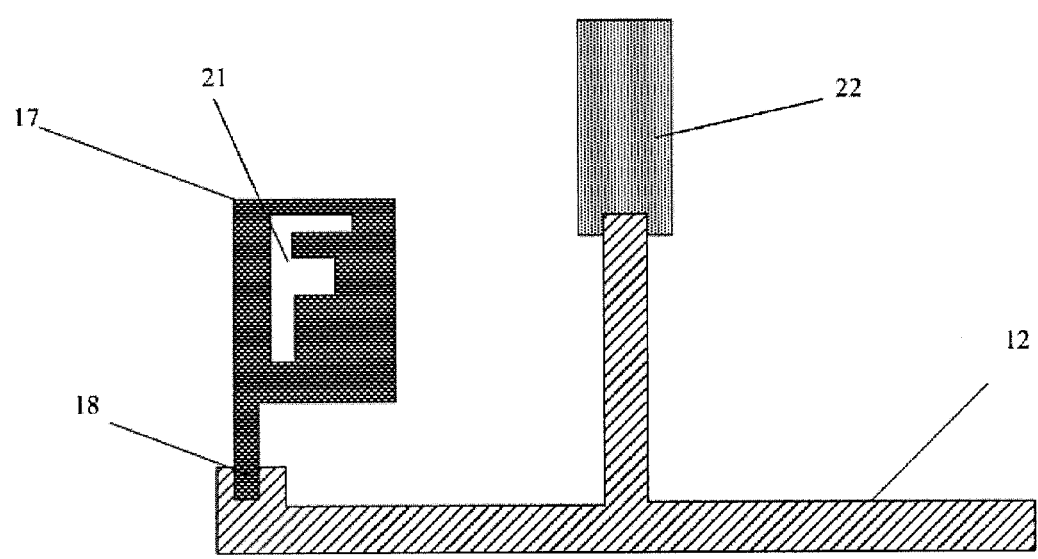
FIG. 3 is a schematic plan view of a region of an array substrate where an alignment mark structure is formed according to an exemplary embodiment of the present invention.

Further, as shown in FIG. 3, an "F"-shaped pattern 21 may be formed, for example, in the alignment mark.

Conventionally, the pattern formed in the alignment mark on the pixel electrode layer is an "L"-shaped pattern generally (i.e., achieved by etching away the "L"-shaped region), and such an alignment mark may be easily misrecognized. In an exemplary embodiment of the present invention, the pattern in the alignment mark can be more complex than the conventional "L"-shaped pattern, such as a pattern formed in the shape of an "F" (i.e., achieved by etching away the "F"-shaped region). Compared with the "L"-shaped pattern, the "F"-shaped pattern has stronger directivity, which is favorable for improving accuracy of recognition.

As shown in FIG. 3, a pad 22 connected with the common electrode in the gate and common electrode layer 12 is formed on the array substrate. When performing detection, a common voltage signal is applied on the pad 22 and an electronic beam is emitted to an alignment region where the alignment mark is formed. As for the "F"-shaped pattern in the alignment region, since it contains no metal, electrons cannot be absorbed, so the corresponding device will not sense an electric current. As for the part of the alignment region other than the "F"-shaped pattern, since this part can absorb electrons and generate an electric current, the corresponding device will be able to sense an electric current. In this manner, it can be determined whether the array substrate is aligned correctly.

Further, the detection hole 19 may be formed, for example, in a region where the "F"-shaped pattern 21 is located.

Further, the array substrate may be, for example, a fringe field switching (FFS) substrate.

According to another exemplary embodiment of the present invention, a method of fabricating an array substrate comprises the following steps.

First, a gate and common electrode layer 12 is formed on a glass substrate 11. For example, the gate and common electrode layer comprising a gate pattern and a common electrode pattern can be formed by depositing a first metal layer on the glass substrate and then performing photolithography and wet-etching on the first metal layer. The gate pattern may comprise a gate and a gate line. The common electrode pattern may comprise a common electrode and a common electrode line.

Then, a gate insulation layer 13 is formed on the gate and common electrode layer 12. The gate insulation layer may be formed, for example, by deposition.

And then, an etch barrier layer 14 is formed on the gate insulation layer 13. The etch barrier layer may be formed, for example, by deposition.

And then, the etch barrier layer 14 and the gate insulation layer 13 are etched, for example, by photolithography and dry-etching, so as to form a first via hole 18.

And then, a source-drain electrode layer 20 is formed on the etch barrier layer 14 and an inner wall of the first via hole 18. For example, the source-drain electrode layer may be formed by depositing a second metal layer on the etch barrier layer 14 and the inner wall of the first via hole 18.

And then, an alignment mark 17 is formed in the source-drain electrode layer 20, wherein the alignment mark 17 can be connected with the common electrode in the gate and common electrode layer 12 through the first via hole 18. For example, the alignment mark can be formed by photolithography and wet-etching. Furthermore, in the step of forming the alignment mark, a source-drain electrode pattern and a corresponding data signal line pattern may also be formed in the source-drain electrode layer 20.

And then, a passivation layer 15 is formed and a pixel electrode layer 16 is formed on the passivation layer 15. The passivation layer 15 can be formed, for example, by depositing passivation material on the source-drain electrode layer 20 in which the alignment mark 17 has been formed, and part of the etch barrier layer 14 and a pixel electrode layer 16 are further formed on the passivation layer 15.

Finally, a region in the pixel electrode layer 16 and the passivation layer 15 that corresponds to the alignment mark 17 is etched so as to form a detection hole 19. For example, portions of the pixel electrode layer 16 and the passivation layer 15 above the alignment mark 17 can be removed by photolithography and dry-etching to form the detection hole 19.

In an exemplary embodiment wherein the array substrate is a TFT substrate, an active layer may be formed on the gate insulation layer 13 and the active layer may be patterned after the gate insulation layer 13 is formed and before the etch barrier layer 14 is formed. The active layer may be made of metal oxides, for example.

In another exemplary embodiment of the present invention, a display device comprising the array substrate described above is provided.

The display device may be, for example, any product or component having a display function, such as an electronic paper, a mobile phone, a tablet computer, a TV set, a display, a laptop, a digital photo frame, a GPS navigator, and so on.

The above embodiments are only exemplary implementations of the present invention and the associated general inventive concepts. It should be noted that one of ordinary skill in the art would appreciate that various modifications and substitutions could be made without departing from the spirit and scope of the present invention.

The invention claimed is:

1. An array substrate comprising
    a glass substrate,
    a gate and common electrode layer,
    a gate insulation layer,
    an etch barrier layer,
    a source-drain electrode layer,
    a passivation layer, and
    a pixel electrode layer,
    said layers being formed sequentially on the glass substrate,
    wherein an alignment mark is formed in the source-drain electrode layer;
    wherein a first via hole is formed in the gate insulation layer and the etch barrier layer;
    wherein the alignment mark is connected with a common electrode in the gate and common electrode layer through the first via hole; and
    wherein a detection hole is formed in a region in the passivation layer and the pixel electrode layer that exposes the alignment mark.

2. The array substrate of claim 1, wherein an "F"-shaped pattern is formed in the alignment mark.

3. The array substrate of claim 2, wherein the detection hole is formed in a region to which the "F"-shaped pattern corresponds.

4. The array substrate of claim 1, wherein the array substrate is a fringe field switching substrate.

5. A method of fabricating an array substrate, the method comprising:
    forming a gate and common electrode layer, a gate insulation layer, and an etch barrier layer sequentially on a glass substrate;
    etching the etch barrier layer and the gate insulation layer to form a first via hole;
    forming a source-drain electrode layer on the etch barrier layer and an inner wall of the first via hole;
    forming an alignment mark in the source-drain electrode layer, the alignment mark being connected with a common electrode in the gate and common electrode layer through the first via hole;
    forming a passivation layer;
    forming a pixel electrode layer on the passivation layer; and
    etching a region in the pixel electrode layer and the passivation layer that exposes the alignment mark to form a detection hole.

6. The method of claim 5, wherein forming the alignment mark in the source-drain electrode layer comprises forming an "F"-shaped pattern in the source-drain electrode layer by etching.

7. The method of claim 6, wherein etching the region in the pixel electrode layer and the passivation layer that corresponds to the alignment mark to form the detection hole comprises etching a region in the pixel electrode layer and the passivation layer that corresponds to the "F"-shaped pattern to form the detection hole.

8. A display device including
    an array substrate, the array substrate comprising
    a glass substrate,
    a gate and common electrode layer,
    a gate insulation layer,
    an etch barrier layer,
    a source-drain electrode layer,
    a passivation layer, and
    a pixel electrode layer,
    said layers being formed sequentially on the glass substrate,
    wherein an alignment mark is formed in the source-drain electrode layer;
    wherein a first via hole is formed in the gate insulation layer and the etch barrier layer;
    wherein the alignment mark is connected with a common electrode in the gate and common electrode layer through the first via hole; and
    wherein a detection hole is formed in a region in the passivation layer and the pixel electrode layer that exposes the alignment mark.

9. The display device of claim 8, wherein an "F"-shaped pattern is formed in the alignment mark.

10. The display device of claim 9, wherein the detection hole is formed in a region to which the "F"-shaped pattern corresponds.

11. The display device of claim 8, wherein the array substrate is a fringe field switching substrate.

* * * * *